United States Patent
Takahashi

[11] Patent Number: 5,956,182
[45] Date of Patent: Sep. 21, 1999

[54] PROJECTION OPTICAL SYSTEM

[75] Inventor: Tomowaki Takahashi, Yokohama, Japan

[73] Assignee: Nikon Corporation, Tokyo, Japan

[21] Appl. No.: 08/906,981

[22] Filed: Aug. 6, 1997

[30] Foreign Application Priority Data

Aug. 7, 1996 [JP] Japan .................................. 8-208649

[51] Int. Cl.$^6$ .................................................. G02B 3/00
[52] U.S. Cl. ............................................................ 359/649
[58] Field of Search ................................. 359/649–651, 359/754–756; 355/53

[56] References Cited

U.S. PATENT DOCUMENTS

| | | | |
|---|---|---|---|
| 3,897,138 | 7/1975 | Kano | 350/183 |
| 5,260,832 | 11/1993 | Togino et al. | 359/679 |
| 5,636,000 | 6/1997 | Ushida | 355/50 |
| 5,805,344 | 9/1998 | Sasaya | 359/649 |
| 5,808,814 | 9/1998 | Kudo | 359/754 |

FOREIGN PATENT DOCUMENTS

| | | | |
|---|---|---|---|
| 0717299A1 | 2/1995 | European Pat. Off. | G02B 13/24 |
| 0721150A2 | 9/1995 | European Pat. Off. | G03F 7/20 |
| 58174298 | 9/1983 | Japan | G02B 13/24 |
| 935099 | 2/1982 | U.S.S.R. | G02B 13/22 |

*Primary Examiner*—Georgia Epps
*Assistant Examiner*—Michael A Lucas
*Attorney, Agent, or Firm*—Chapman and Cutler

[57] ABSTRACT

A projection optical system which has high efficiency and a wide exposure area is used to provide a desired image surface flatness and yet is of a practical size. A first element group including at least two pairs of convex surfaces facing each other, a second element group including at least two pairs of concave surfaces facing each other, a third element group including at least two pairs of convex surfaces facing each other, a fourth element group including at least two pairs of concave surfaces facing each other, and a fifth element group including at least two pairs of convex surfaces facing each other are provided, in that order, from a side of an object. Various predetermined conditions are satisfied.

19 Claims, 16 Drawing Sheets

$i = \theta + u$

CONCAVE SURFACE
OPPOSING LIGHT
BEAM ENTRY $i = \theta - u$

CONCAVE SURFACE
FACING LIGHT
BEAM ENTRY

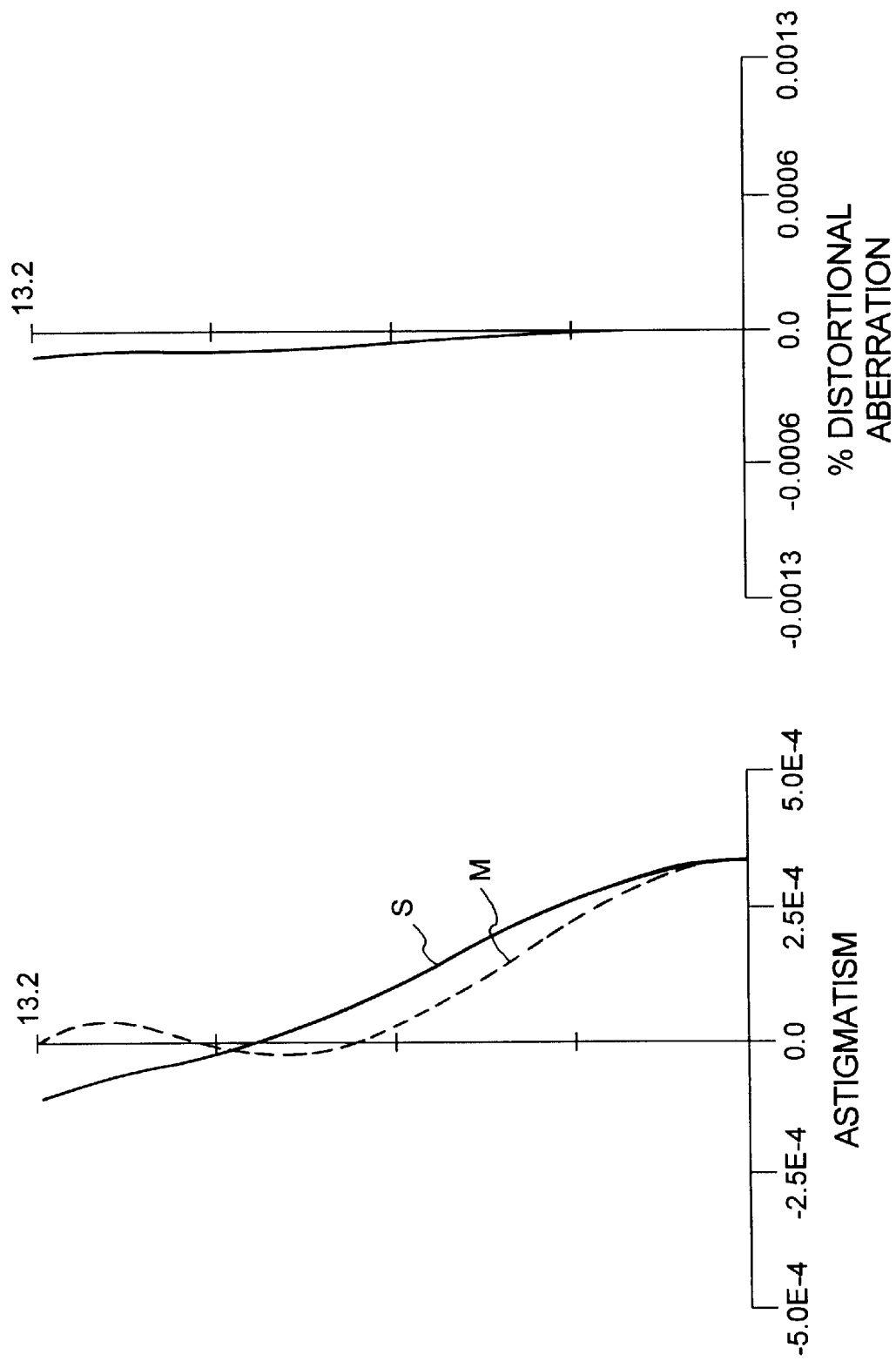

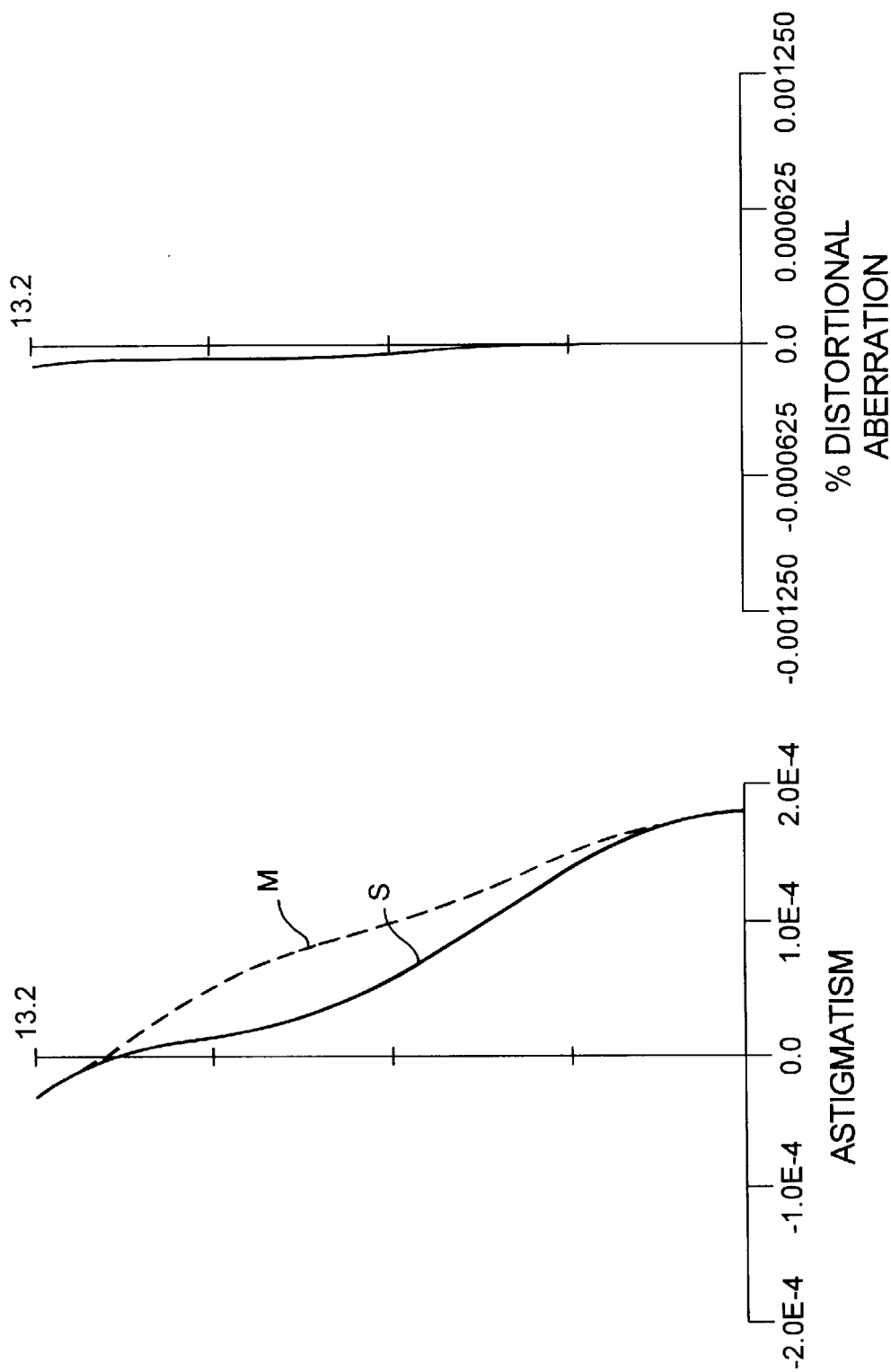

PROJECTION OPTICAL SYSTEM

BACKGROUND OF THE INVENTION

1. Field of the Invention

In this specification, the term "convex surface" refers to a surface in which a center portion of an element of glass material is swollen or enlarged as compared to the periphery of the element of glass material. The term "concave surface" refers to a surface in which a center portion of an element of glass material is caved in or reduced in thickness as compared to the periphery of the element of glass material. Finally, the term "element group" refers to a group of refractive surfaces; such a group is not always surrounded by mediums such as air.

This invention relates to a projection optical system used in a projection exposure apparatus which transcribes a reticle having an electric circuit pattern onto a surface of a semiconductor wafer.

2. Description of Related Art

Conventionally, in production of IC and LSI integrated circuits and liquid crystal flat displays, projection exposure methods using projection exposure apparatuses are used.

In these kinds of projection exposure apparatuses, in order to provide excellent resolution and an exposure area of sufficient width, projection optical systems such as those disclosed in U.S. Pat. No. 5,260,832 and Laid-Open Japanese Patent Publication 7-140384 are used.

The integrated circuit patterns of semiconductors are becoming increasingly microscopic. The necessary exposure areas of the liquid crystal flat displays, moreover, are becoming wider.

In this context, the optical performance required for a projection optical system used for IC exposure needs to be further improved. Conventional high performance Gaussian types of systems, such as that forming the subject matter of U.S. Pat. No. 5,260,832, are becoming inadequate.

A five-group construction projection optical system is disclosed in Japanese Laid-Open Patent Publication 7-140384. In this case, among three positive refractive power convex lens groups, one pair of convex lenses opposing each other has weak refraction power. This pair cannot sufficiently converge a light flux or bundle generated in a concave lens group having negative refractive power. Thus, it is difficult to achieve a sufficiently small overall optical system.

SUMMARY OF THE INVENTION

One object of the present invention is to provide a projection optical system with high performance and wide exposure. These features are especially important for adequate flatness of picture surfaces.

In order to achieve this object, this invention provides a projection optical system which satisfies certain conditions and includes a first element group E1 with positive refractive power having at least two pairs of convex surfaces facing each other, a second element group E2 with negative refractive power including at least two pairs of concave surfaces facing each other, a third element group E3 with positive refractive power including at least two pairs of convex surfaces facing each other, a fourth element group E4 with negative refractive power including at least two pairs of concave surfaces facing each other, and a fifth element group E5 with positive refractive power including at least two pairs of convex surfaces facing each other. The first through fifth element groups are arranged in order from an object side.

When the refractive power of the facing concave surfaces of the second element group E2 and of the fourth element group E4 is ⌀concave, the refractive power of the facing convex surfaces of the third element group E3 and of the fifth element group E5 is ⌀convex, and a distance, in mm, between an object and an image is I, then:

$$0.5 < |L \times \emptyset\text{concave}| < 15; \text{ and}$$

$$0.5 < |L \times \emptyset\text{convex}| < 15.$$

A projection optical system, which includes a first lens group G1 having at least two positive lenses and a positive refractive power as a whole, a second lens group G2 having at least two negative lenses and a negative refractive power as a whole, a third lens group G3 having at least two positive lenses and a positive refractive power as a whole, a fourth lens group G4 having at least two negative lenses and a negative refractive power as a whole, a fifth lens group G5 having at least two positive lenses and a positive refractive power as a whole, a sixth lens group G6 having at least two negative lenses and a negative refractive power as a whole, and a seventh lens group G7 having at least two positive lenses and a positive refractive power as a whole, is provided with these characteristics.

A Gaussian-type of system shown in the upper part of FIG. 1 comprises a convex lens group with positive refractive power (⌀1>0), a concave lens group with negative refractive power (⌀2<0), and a convex lens group with positive refractive power (⌀3>0). Two concave lenses are used for the concave lens group. However, when attempting to achieve a higher optical performance, the incidental angle of light beams entering these two concave lenses tends to become too large for an aberration generated to be corrected by other surfaces.

In order to remedy this situation, each concave lens is switched and divided in front and back. The concave lenses are positioned with opposite concave surfaces facing each other. In this way, a radius of curvature of a concave surface can be doubled. Thus, the incidental angle i2c of each surface can be reduced by ½. This is shown in the bottom half of FIG. 1 and in FIG. 2. The same refractive power as before is maintained. Furthermore, as shown in FIG. 3, because the incidental angle changes depending on the direction in which the surface is oriented, while the refractive power of the lens stays constant, the aberration generated on one surface can be minimized by positioning the concave lenses so that they face in opposite directions. Thus, by enlarging a radius of curvature and positioning the concave surfaces so that they face each other, the aberration generated on each surface can be minimized.

In the aforementioned projection optical system, disclosed in U.S. Pat. No. 5,260,832, it was intended to correct for aberration generated by the concave lens group with a pair of concave surfaces facing in opposite directions. When a lens is inserted between the pair of lenses facing each other in opposite directions, the inserted lens does not contribute much to correcting for the aberration because of its simple construction. Therefore, it has been very difficult to further improve optical system performance.

This invention is constructed to eliminate this shortcoming by giving a negative refractive power to the lens inserted between the concave surfaces facing in opposite directions. The burden of refractive power on both concave surfaces is reduced. In this manner, two concave surfaces facing in opposite directions are positioned successively. When two or more concave surfaces are positioned successively in such manner, distribution of the negative refractive power is remarkable.

Such a transformation permits two concave lenses to become equivalent to four concave lenses. By increasing the number of lenses, and by increasing the number of concave surfaces facing in opposite directions, the aberration generated on the concave surfaces can be further decreased.

Furthermore, as shown in the bottom part of FIG. 1, the same arrangement change is made to the convex lens elements located on both sides of the prior Gaussian-type of system mentioned above. Each convex lens element is further divided such that the front and back are exchanged. The convex surfaces are positioned to face in opposite directions. In this way, the radius of curvature of the convex surface can be doubled while maintaining the same refractive power as before. Thus, the incidental angle i1c of each surface can be reduced by ½ as shown in the bottom part of FIG. 1 and in FIG. 2, and the aberration generated on each surface is also reduced.

One purpose of positioning two pairs of convex surfaces opposite to each other is to weaken a positive refractive power somewhat when a surface having a negative refractive power is inserted. This is effective to correct for spherical aberration and coma aberration. A decline in a positive refractive power can be compensated for by increasing the positive refractive surfaces included in other element groups. Four convex lenses become equivalent to eight lenses by such a transformation. However, pairs of surfaces facing in opposite directions may be increased by increasing the number of lenses; in this situation, more aberration generation can be suppressed. However, in such cases, by increasing the number of lenses, an increased reflection of light may result in increased flare, even when an anti-reflection coating is given to the refractive surface of each lens. Moreover, the cost for polishing lenses also increases. The number of lenses disposed so that flat surfaces thereof face each other can be reduced by combining plural lenses into a single lens. The incidental angles of the entering light beam will not be increased by this construction. For example, the second and the third lenses are connected to make one convex lens in the bottom part of FIG. 1. Similar constructions are possible for the fourth and the fifth lenses, the sixth and the seventh lenses, the eighth and the ninth lenses, and the tenth and the eleventh lenses.

When the above constructions are carried out, the optical system comprises seven lenses as shown in FIG. 2. Relative to the six lens prior art construction, merely one lens is added. However, the pair of concave lenses facing each other in opposite directions included in the negative refraction element group in the center increases from one pair to two pairs. Each pair of convex lenses facing each other in opposite directions included in the positive refractive power element groups on both ends can be increased from one pair to two pairs.

The above surface arrangement causes the concave lens element in the center to cancel out a positive Petzval sum generated by two positive lens groups of the prior art Gaussian type.

The first point of the present invention is set out above. In this invention, instead of the prior three-group arrangement shown in FIG. 4, which includes a positive refractive power group, a negative refractive power group, and another positive refractive power group, a five-group arrangement shown in FIG. 5 is adopted. This five-group arrangement includes a positive refractive power group, a negative refractive power group, a positive refractive power group, a negative refractive power group, and a positive refractive power group in order from the object side. The five-group arrangement yields a whole optical system of practical size.

In other words, a smaller optical system is achieved. To simplify the explanation of three-group positioning, if the refractive powers of positive refractive power groups on both sides are almost equal to each other, then the Petzval sum is canceled out when the refractive power of the negative refractive power group in the center is set to be twice the refractive power of the positive refractive power groups. In other words, if the refractive power of the positive refractive power group is normalized at 1, then the refractive power of the negative refractive group needs to be set at −2 such that its absolute value is doubled. However, in the five-group arrangement, in which a positive refractive group, a negative refractive group, a positive refractive group, a negative refractive group, and a positive refractive group are arranged in that order, when the refractive power of each positive refractive power group is set at 1, then a grand total of 3 results. This value of 3 is canceled out by the two negative refractive power groups. Thus, the refractive power of one negative refractive power group becomes only −1.5. This produces a reduction in the refractive angle of each lens constructed of negative refractive power groups and contributes to a reduction in aberration generation.

On the other hand, from a different perspective, if the refractive power of the negative refractive power group is set at −2, similar to the setting in the three-group arrangement, then the total sum of the refractive power of two negative refractive power groups becomes −4, and the corresponding total sum of the refractive power of the positive refractive power group becomes 4. When this is divided by three positive refractive power groups, one positive refractive power group has a refractive power of ⁴⁄₃=1.333. By maintaining the incidental angle of the light beam entering the positive refractive power group, without changing the aberration generation rate significantly, the refractive power can be almost tripled. Thus, the whole optical system can be made smaller by a corresponding amount.

To simplify the explanation made above, the refractive powers of positive refractive power groups on both sides are set equal. However, one is not limited to this construction. The construction can be generalized. To easily show differences in overall length and diameter between the three-group arrangement and the five-group arrangement, consider a case in which an imaging magnification is constructed equally with an optical system overall having equal imaging magnification.

In the negative refractive power group of the three-group arrangement shown in FIG. 4, if the refractive power of the negative refractive power group is normalized at 1, then a focal length becomes 1, which is its reciprocal. The refractive power of the negative refractive power group becomes −2, and its focal length becomes −0.5. Therefore, the distance between an object and an image becomes 6, and the refractive power of the negative refractive power group as a whole becomes −4, because two negative refractive power groups exist. Because the Petzval sum generated from these negative refractive power groups must be canceled out by three positive refractive power groups, the refractive power of one positive refractive power group must be ⅓. Thus, the focal distance becomes ¾. Assuming that the imaging magnification of each group is equal, the distance between an object and an image is 5 as shown in FIG. 5, and the effective radius becomes ¾ for the same NA. In this way, the optical system can be made smaller.

The five-group arrangement shown in FIG. 5 has a positive refractive power group, a negative refractive power group, a positive refractive power group, a negative refractive power group, and a positive refractive power group. If the refractive power of the negative refractive power groups, in which aberration is easily generated, is set at −2 (the same value as in the three-group arrangement), then the refractive power of the negative refractive power group as a whole becomes −4. This is because two negative refractive power groups exist. Because the Petzval sum generated from these negative refractive power groups must be canceled out by three positive refractive power groups, the refractive power of one positive refractive power group must be 4/3. Thus, the focal distance becomes 3/4. Assuming that the imaging magnification of each group is equal, the distance between an object and an image is 5 as shown in FIG. 5, and the effective radius becomes 3/4 for the same NA. In this way, the optical system can be made smaller.

The simplified explanation provided above is valid when each group and the entire optical system have a magnification power of 1. However, it is clear that similar tendencies can be found in ordinary magnification. By arranging five groups as discussed above, the effective radius of the positive refractive power group can be made smaller in principal. As the effective radius becomes smaller, the curvature of the surfaces facing each other in opposite directions can be made stronger without generating much aberration. The same is true for the negative refractive power group which has more margin. Curvatures of the surfaces facing in opposite directions can be made stronger. However, if the curvature is made too strong, correcting for aberration becomes difficult. Thus, in the present invention, when the refractive power of a concave surface is øconcave, the refractive power of a convex surface is øconvex, and the distance, in mm, between an object and image is L, the following conditions need to be satisfied:

$$0.5 < |L \times \text{øconcave}| < 15 \quad (1)$$

$$0.5 < |L \times \text{øconvex}| < 15 \quad (2)$$

If the maximum of condition (1) is exceeded, then the negative refractive power on the concave surface is strengthened. This also is beneficial for correcting the Petzval sum. However, too much coma aberration is generated. Thus, corrections on other surfaces become difficult. Moreover, when the minimum of condition (1) is not met, negative refractive powers on concave surfaces are weakened. In this case, corrections of the Petzval sum becomes insufficient. Thus, an image plane becomes curved, and a wide field (i.e., exposure area) cannot be obtained because of insufficient correction levels of the Petzval sums. When a minimum value is set at 1.5 and a maximum value is set at 10, even better results can be obtained.

When the maximum of condition (2) is exceeded, the positive refractive power on convex surfaces is strengthened. Thus, a large coma aberration is generated and an image plane becomes curved because of insufficient corrections of the Petzval sums. Consequently, a large field (i.e., a large exposure area) cannot be obtained. When the minimum of condition (2) is not met, the positive refractive power on convex surfaces is weakened. This is beneficial for correcting the Petzval sum. However, the effective radius of the lens forming the positive refractive power group becomes excessively large. The overall length of lenses forming the positive refractive power group is enlarged as well. Thus, the size of the optical system becomes larger. When the minimum value is set at 1.5 and the maximum value is set at 10, more desirable results can be obtained.

In the projection optical system disclosed in Japanese Laid-Open Patent Publication 7-140384, among three positive refractive power groups, pairs of convex surfaces facing in opposite directions include a surface having weak refractive power. The condition required by the present invention is not satisfied. Thus, a light flux or bundle generated in the negative refractive power group cannot be sufficiently converged, and it is difficult to make the optical system sufficiently small. Moreover, among two negative refractive power groups, the pairs of concave lenses facing in opposite directions include a surface having weak refractive power. The condition required by the present invention is not satisfied. Therefore, the light bundle generated in the positive refractive power group cannot be sufficiently converged, resulting in a great overall optical system length. Accordingly, it is difficult to make a compact optical system smaller.

A six-group arrangement can be made by adding a negative refractive power group on the object side. Moreover, if a seven-group arrangement is made by adding a negative refractive group and a positive refractive group on the object side, then the distance between the object and the image becomes 4.67 and the effective radius of the lens of the convex lens group is 0.67 and thus even smaller. Additional negative and positive refractive power groups are used when NA is small; thus, only a few lenses are needed and it is unnecessary for each of the additional groups to include surfaces facing in opposite directions.

In the simplified explanation provided above, the refractive index of each group is constant, the imaging magnification of each group is restricted to a constant, the refractive power of each negative refractive power group is constant, the refractive power of each positive refractive power group is constant, the distance between the groups is constant, and the imaging magnification of the entire optical system is restricted to a constant. However, even when an accurate calculation is carried out in an actual optical system, this tendency to constant values does not change.

The principal of the present invention discussed above is not restricted to five-group and seven-group arrangements. This principal generates good results as long as a positive refractive power group and a negative refractive power group are arranged alternately from the object side of the arrangement. A seven-group arrangement having a positive refractive power group, a negative refractive power group, a positive refractive power group, a negative refractive power group, a positive refractive power group, a negative refractive power group, and a positive refractive power group is shown in FIG. 9. When such a seven-group arrangement is constructed, good performance can be obtained while minimizing the number of lenses. If an increase in the number of lenses is allowed, then nine-group and eleven-group arrangements are possible.

By arranging the positive and negative refractive power groups alternately, the light bundle diverged from the negative refractive power can be converged by the positive refractive power convex groups before spreading too much. By repeating this process, the refractive power on the negative refractive power group is distributed and the Petzval sum yields a good value. The above is the second point of the present invention.

By connecting the first and the second points above, the advantage of the present invention is effectively brought about. In other words, as shown in FIG. 7, pairs of convex surfaces facing each other and pairs of concave surfaces facing each other are positioned at adequate positions in a refractive power arrangement in which a positive refractive power group (ø1>0), a negative refractive power group (ø2<0), a positive refractive power group (ø3>0), a negative refractive power group (ø4<0), and a positive refractive power group (ø5>0) are arranged from an object in this order. In further detail, more than two pairs of convex surfaces facing each other are included in each positive refractive power group, and more than two pairs of concave lenses facing each other are included in each negative refractive power group to satisfy conditions (1) and (2). At this time, the refractive power groups are grouped by type of refractive surface and are made into element groups.

If only the first point of the present invention is satisfied, then the refractive power of the negative refractive power group can be made larger while suppressing the generated aberration. However, the divergent angle of light bundle from the negative refractive power group becomes too large and, therefore, the effective radius of the positive refractive power group becomes enlarged. The lens diameter of this positive refractive power group cannot be made larger and, as a result, the refractive power of the negative refractive power group can be made larger only to a certain extent. If only the second point of the present invention is satisfied, then a positive refractive power group, which does not include convex surfaces facing in opposite directions, and a negative refractive power group, which does not include concave surfaces facing in opposite directions, are positioned alternately. In an extreme case, the optical system becomes what is referred to as a rod lens, shown in FIG. 8, in which a positive lens and a negative lens are positioned alternately. This system has the same performance level as an optical system in which one rod and one positive lens are combined. In such an optical system, many refractive surfaces exist and the flexibility with which the aberration can be corrected seems to be high. However, the incident angle of a light beam entering each lens group cannot be made smaller, and it is difficult to correct for aberration.

An illustration of an assembly similar to that disclosed by U.S. Pat. No. 5,260,832 is shown in FIG. 10. In this illustration, a positive refractive power group is positioned after a pair of concave surfaces facing in opposite directions. A pair of concave surfaces facing in opposite directions is further included. As can be seen in FIG. 10, the incidental angle i2b of light beams is not as large as that in the optical system shown in FIG. 8. However, it is larger than the incident angle in the optical system of the present invention shown in FIG. 9.

It is clear that the advantages of the present invention can be effectively displayed by combining the first and the second points of the present invention.

In the above, an explanation was given in reference to element groups determined by refractive surface type. Instead, elements included in the optical system can be grouped by type of lens. The optical system includes a first lens group G1 with an overall positive refractive power which has at least two positive lenses, a second lens group G2 with overall negative refractive power which has at least two negative lenses, a third lens group G3 with overall positive refractive power which has at least two positive lenses, a fourth lens group G4 with overall negative refractive power which has at least two negative lenses, a fifth lens group G5 with overall positive refractive power which has at least two positive lenses, a sixth lens group G6 with overall negative refractive power which has at least two negative refractive lenses, and a seventh lens group G7 with overall positive refractive power which has at least two positive lenses. The lens groups G1–G7 are arranged in order from the object side.

From the second point of the present invention, the first lens group with positive refractive power through the fifth lens group with positive refractive power are necessary according to the above explanation. Furthermore, in order to include two pairs of concave lenses or convex lenses facing each other, at least two negative or positive lenses are necessary. When the system is divided by element groups, conditions (1) and (2) are necessary. However, when construction is achieved by a projection optical system divided by lenses, instead of satisfying conditions (1) and (2), the sixth lens group G6 with negative refractive power and the seventh lens group G7 with positive refractive power become necessary.

In order to prevent distortion of an image which is caused by poor object (i.e., reticle) flatness and poor image (i.e., wafer) flatness, it is desirable to locate the entrance pupil on the object side and the exit pupil on the image side at infinity so as to construct what is referred to as a "double-telecentric system" as the projection optical system of the present invention. In the following embodiments, telecentricity is assured by positioning positive refractive power groups on the object side and on the image side.

BRIEF DESCRIPTION OF THE DRAWINGS

FIGS. 13A and 13B show diagrams representing astigmatism and distortional aberration of the projection optical system according to the first embodiment.

FIGS. 16A and 16B show diagrams representing astigmatism and distortional aberration of the projection optical system according to the second embodiment.

DESCRIPTION OF THE PREFERRED EMBODIMENTS

Numerical embodiments of the present invention are further described in the following.

First embodiment

The first embodiment is a projection optical system which has ¼ magnification. A numerical aperture NA on an image side is 0.6 and a maximum object height is 52.8 mm. An area in a reticle size of 74.5×74.5 mm² (lump-some exposure) or 90×55 mm² (scanned exposure) can be exposed.

A fused quartz having a refractive index of 1.50839 is used as an optical glass. An optical system having an excellent performance is provided by using a total of 29 lenses and a filter near an aperture stop, thus correcting for spherical aberration, coma aberration, astigmatism, and distortion aberration for a 248 nm monochromatic wavelength of an ultraviolet excimer laser.

A very small optical system, which has a maximum effective lens diameter of 220 mm or less and an object-image distance of 1144 mm, can be obtained.

Figure 1:
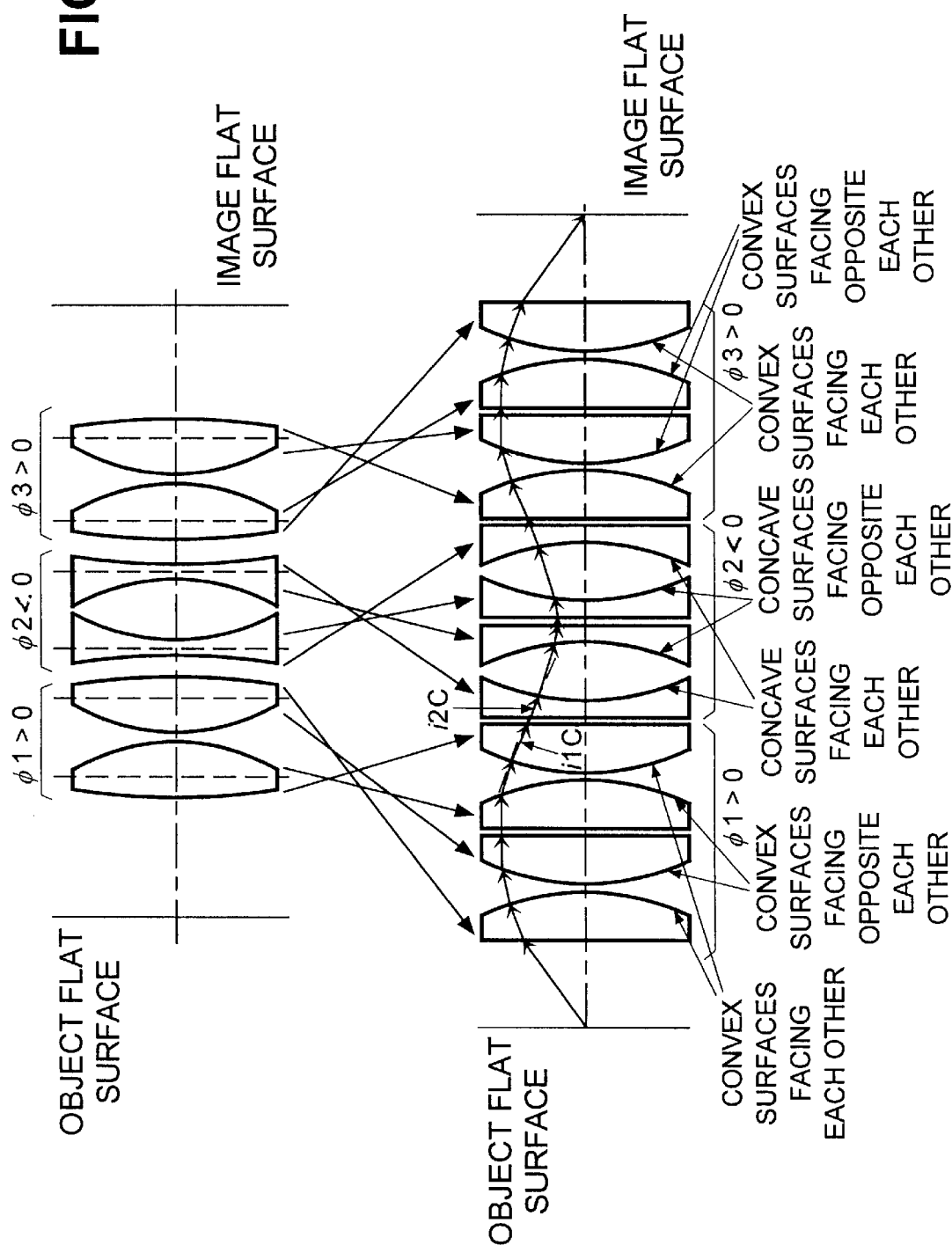
FIG. 1 is a view of a system used to describe a basic concept of the first effect of the present invention.
Figure 2:
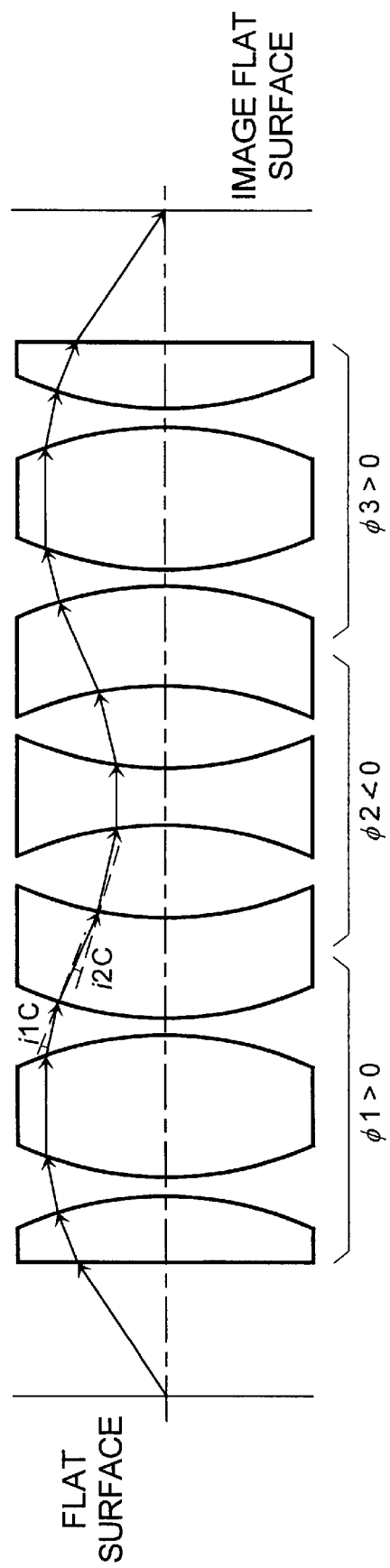
FIG. 2 is an enlarged view of a structure provided between flat surfaces of the examples shown in FIG. 1.
Figure 3A:
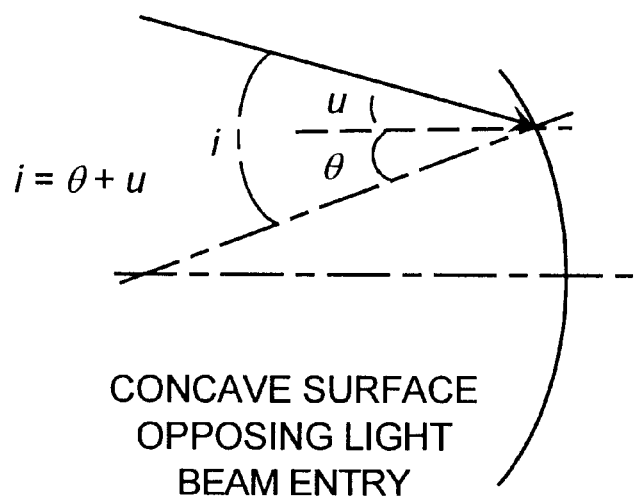
FIGS. 3A and 3B are an illustration of an entering light beam incident upon different incidental surfaces.
Figure 3B:
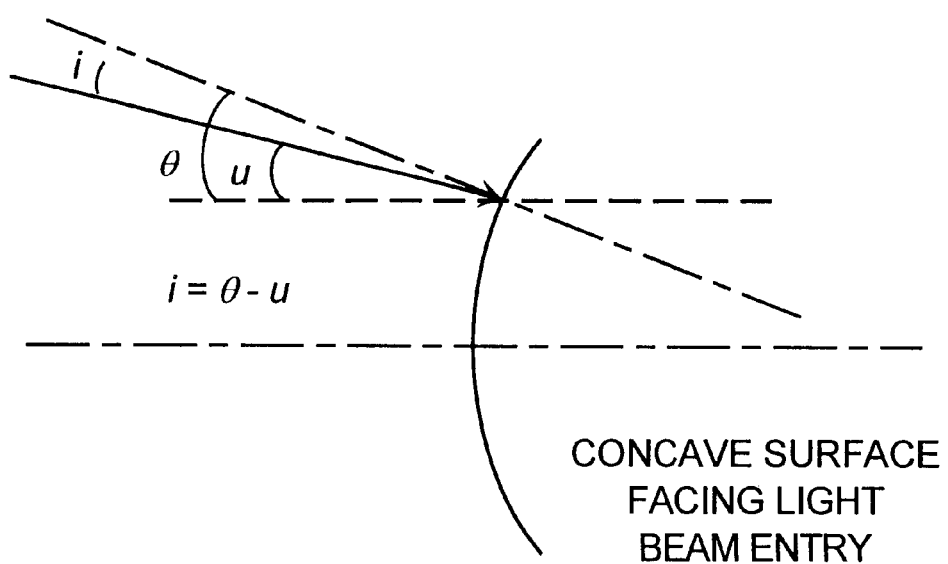
Figure 4:
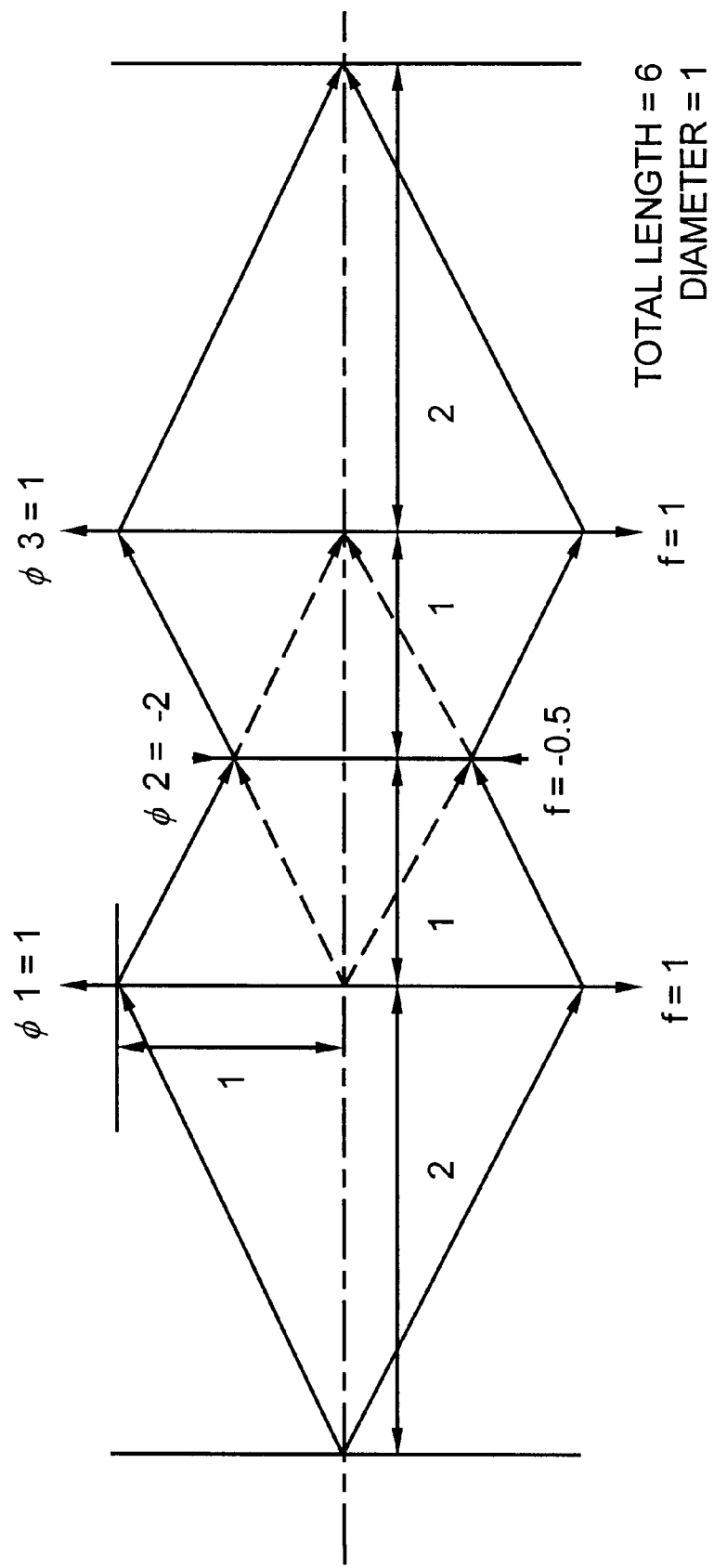
FIG. 4 shows a refractive power arrangement of a known projection optical system.
Figure 5:
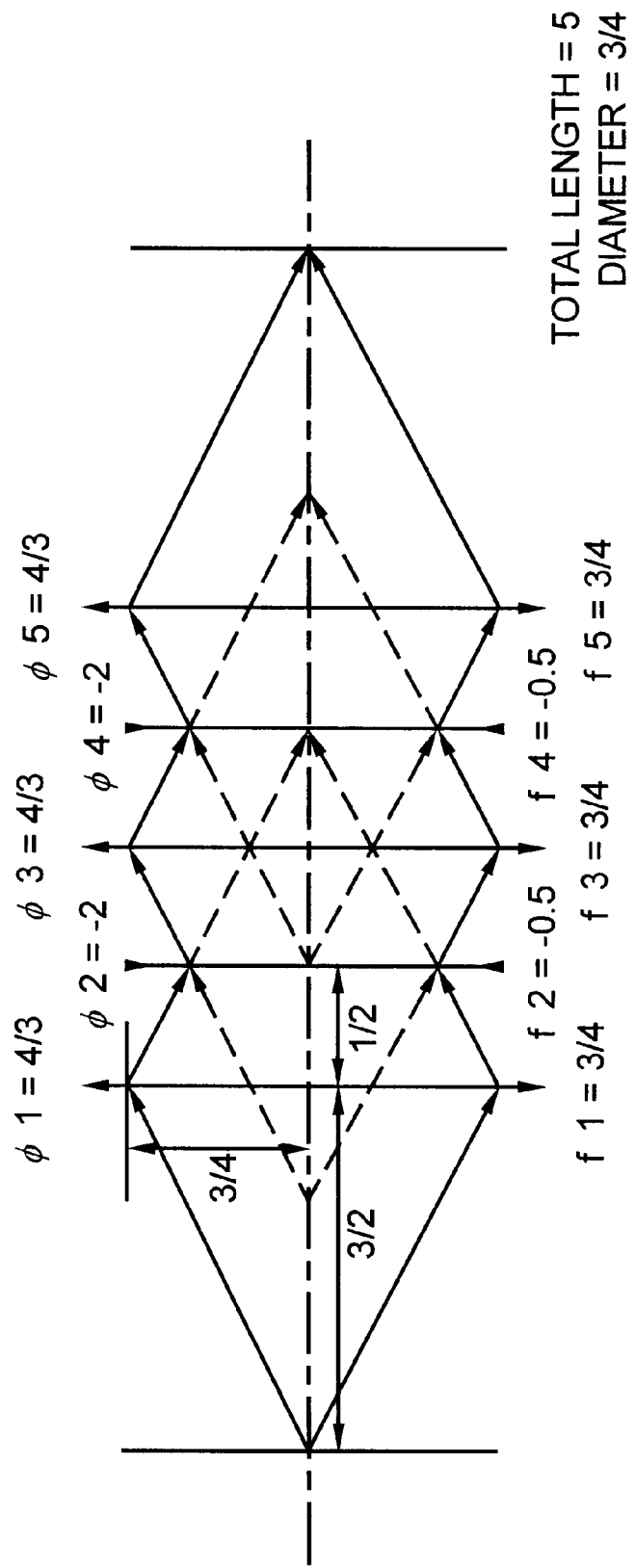
FIG. 5 shows a refractive power arrangement of a projection optical system of the present invention which is used for discussion of the basic concept of the second effect of the invention.
Figure 6:
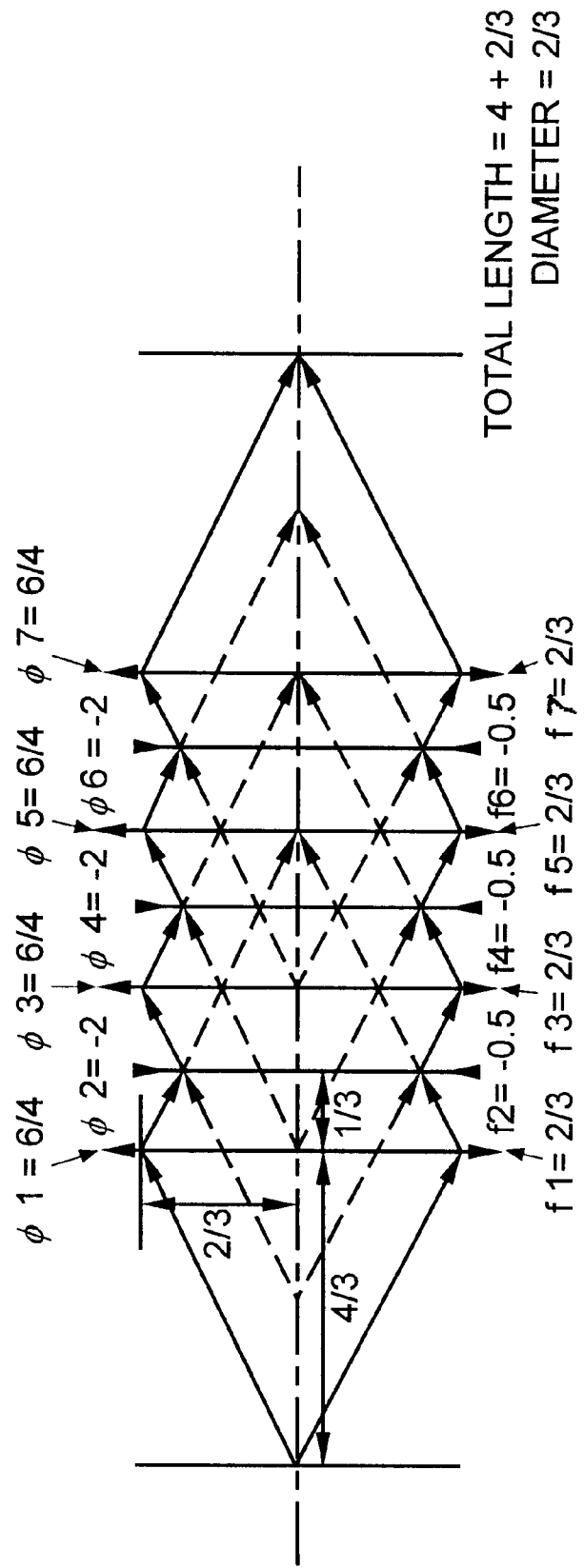
FIG. 6 shows a refractive power arrangement of a projection optical system further extended from the arrangement shown in FIG. 5.
Figure 7:
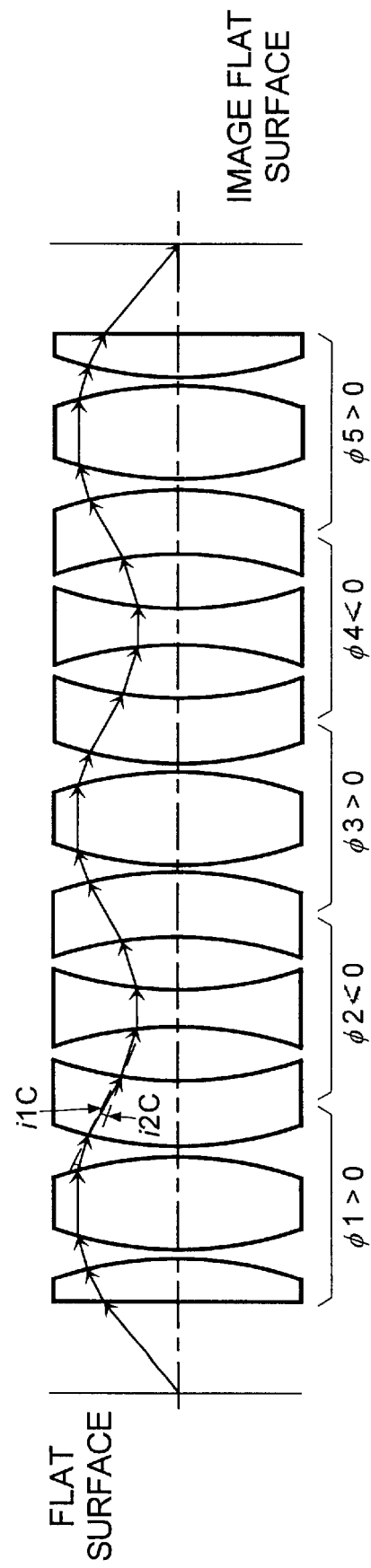
FIG. 7 is a view of a system used to describe a basic concept of a projection optical system of the present invention.
Figure 8:
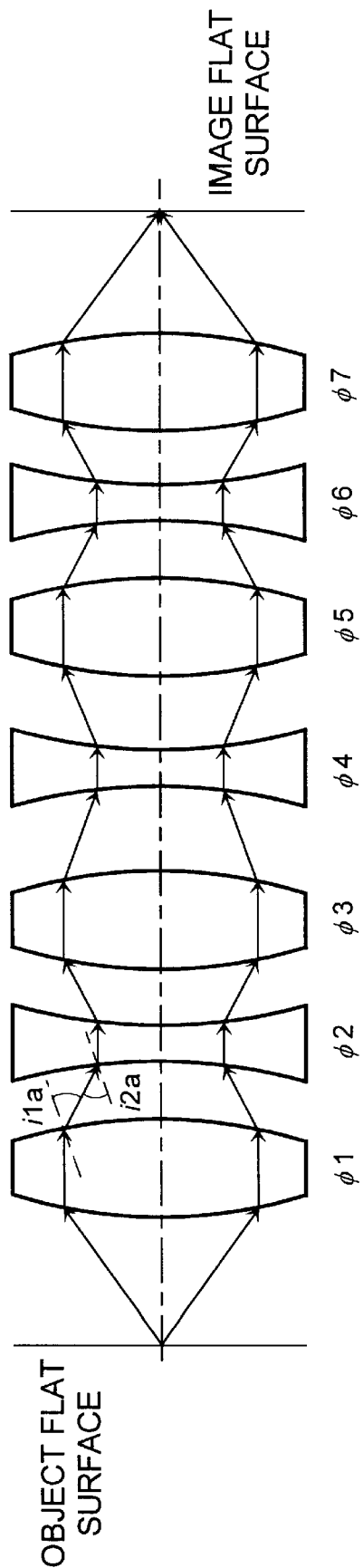
FIG. 8 shows lens positions of a prior art projection optical system.
Figure 9:
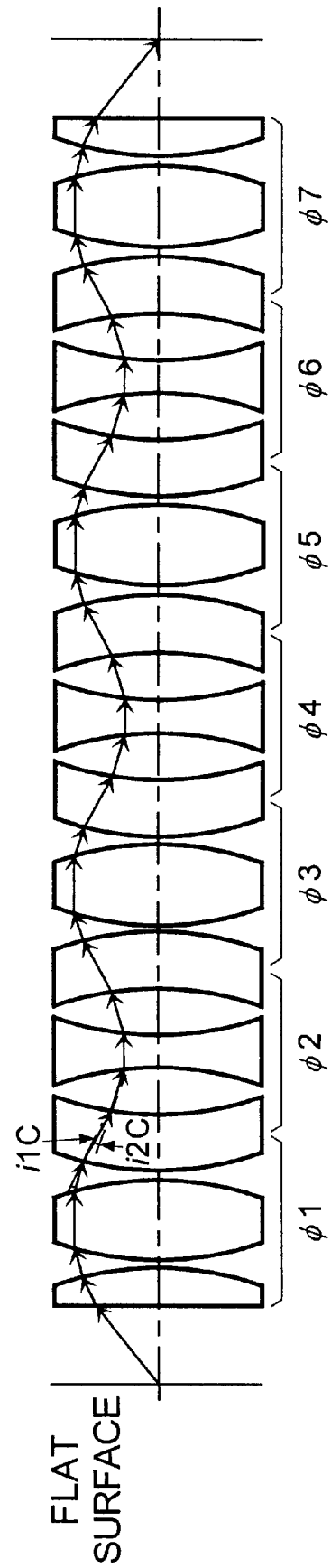
FIG. 9 shows lens positions of the refractive power arrangement shown in FIG. 6.
Figure 10:
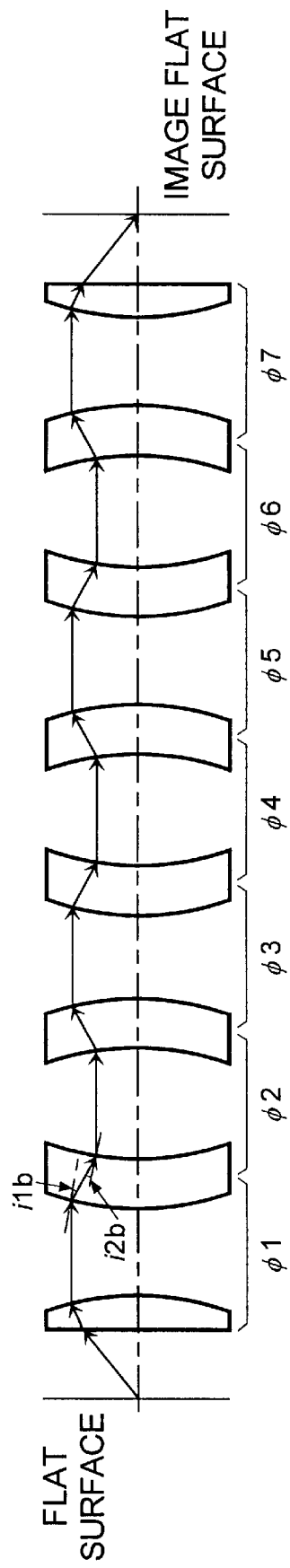
FIG. 10 shows lens positions of another prior art projection optical system.
Figure 11:
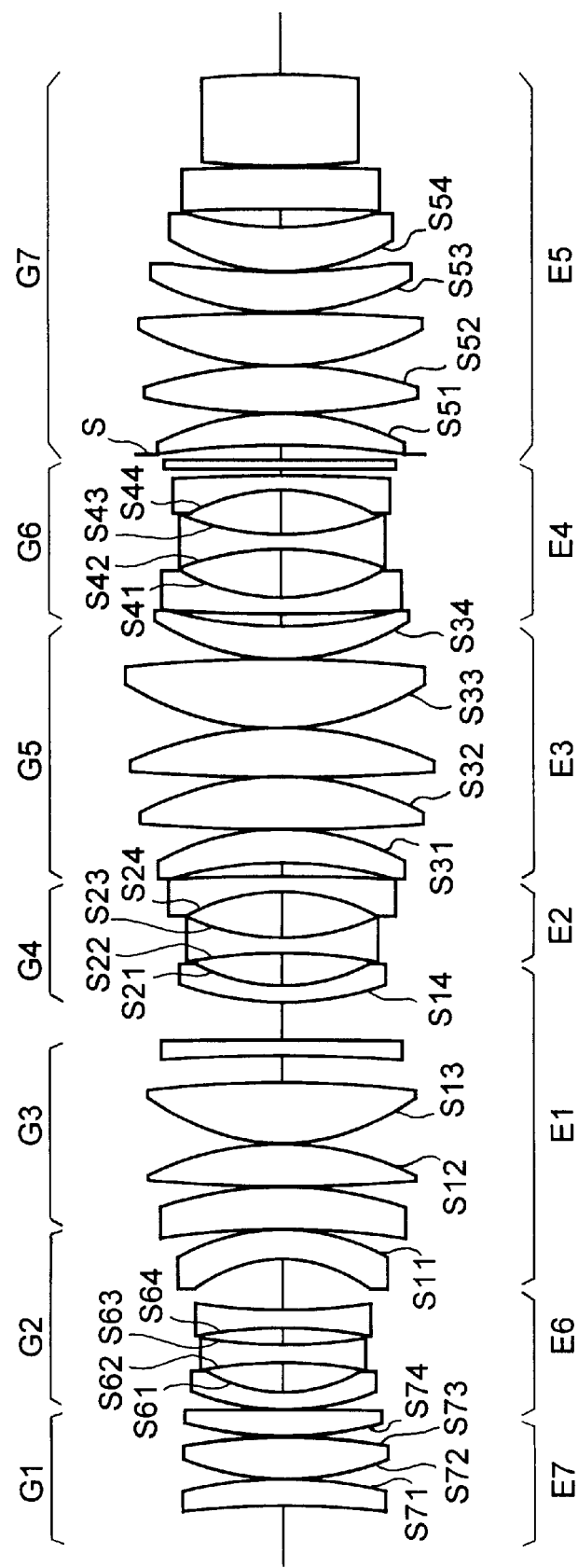
FIG. 11 shows a cross section of a projection optical system according to the first embodiment of the invention.
Figure 12A:
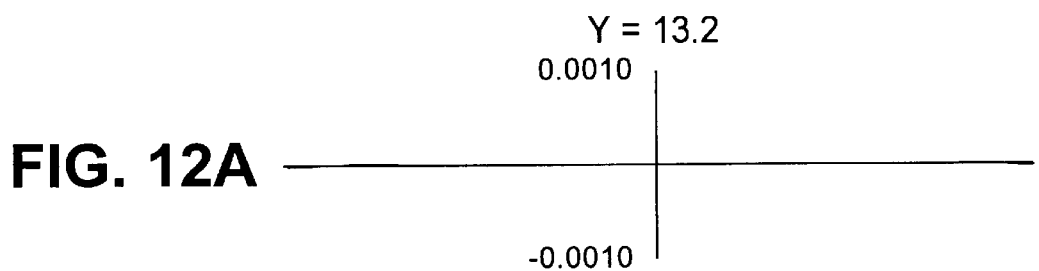
FIGS. 12A through 12D show diagrams representing a side aberration of the projection optical system according to the first embodiment.
Figure 12B:
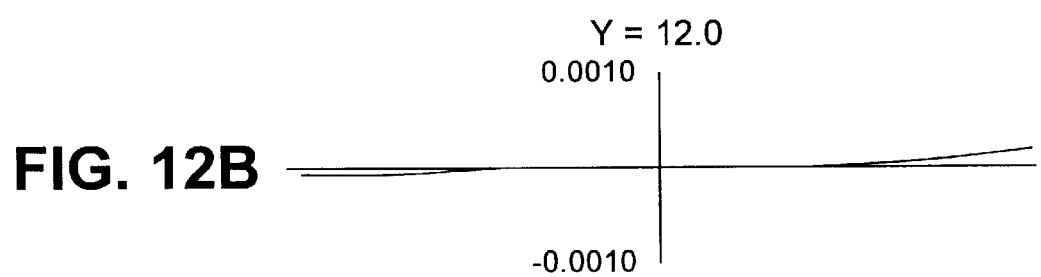
Figure 12C:
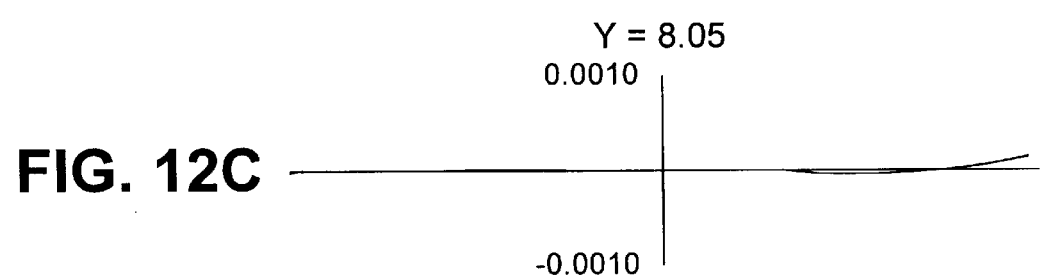
Figure 12D:
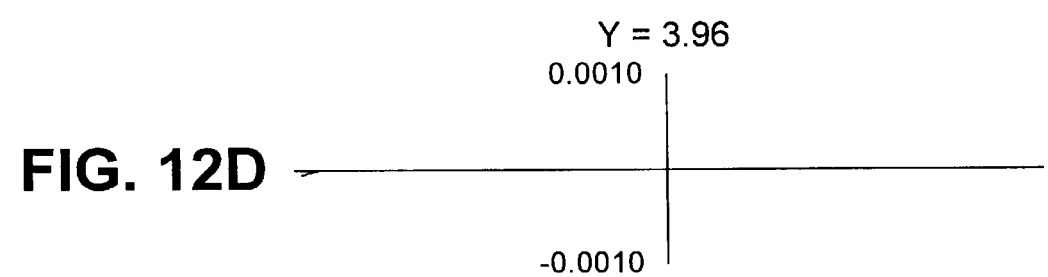

Parameters of the first embodiment are shown in Table 1. FIG. 11 shows a cross section of the optical system according to the first embodiment, FIG. 12 illustrates the side aberration of the optical system of the first embodiment, and FIG. 13 illustrates the astigmatism and distortional aberration of the optical system of the first embodiment. In Table 1, the fused quartz is designated as QUARTZ. The side aberration is shown for image heights Y of 13.2, 12.0, 8.05, and 3.96 mm. In the figure representing astigmatism, an origin is the best image plane, and a Gaussian image plane is not a standard.

The convex surfaces facing each other in the first element group E1 are S11 through S14. The concave surfaces facing each other in the second element group E2 are S21 through S24. The convex surfaces facing each other in the third element group E3 are S31 through S34. The concave surfaces facing each other in the fourth element group E4 are S41 through S44. The convex surfaces facing each other in the fifth element group E5 are S51 through S54. The concave surfaces facing each other in the sixth element group E6 are S61 through S64. The convex surfaces in the seventh element group E7 which face each other are S71 through S74.

Conditions and corresponding values are shown in Table 2.

TABLE 1

| surface number | radius of curvature | surface distance | material | | | |
|---|---|---|---|---|---|---|
|  | 0.0 | 105.268 |  | reticle |  |  |
| 1 | −669.68334 | 20.0 | QUARTZ | E7 |  | G1 |
| 2 | −309.99459 | 0.1 |  |  | S71 |  |
| 3 | 210.29663 | 27.886 | QUARTZ |  | S72 |  |
| 4 | −516.37585 | 0.100 |  |  | S73 |  |
| 5 | 270.30754 | 19.249 | QUARTZ |  | S74 |  |
| 6 | −7567.33941 | 0.100 |  |  |  |  |
| 7 | 182.90544 | 11.000 | QUARTZ |  |  | G2 |
| 8 | 104.85643 | 20.500 |  | E6 | S61 |  |
| 9 | −264.44547 | 11.000 | QUARTZ |  | S62 |  |
| 10 | 172.70392 | 16.000 |  |  | S63 |  |
| 11 | −249.30625 | 11.000 | QUARTZ |  | S64 |  |
| 12 | 235.21985 | 35.766 |  |  |  |  |
| 13 | −111.29536 | 23.005 | QUARTZ |  |  |  |
| 14 | −133.32390 | 0.100 |  | E1 | S11 |  |
| 15 | −460.00737 | 30.000 | QUARTZ |  |  | G3 |
| 16 | −223.26007 | 0.100 |  |  |  |  |
| 17 | 1915.62813 | 30.000 | QUARTZ |  |  |  |
| 18 | −211.75310 | 0.100 |  |  | S12 |  |
| 19 | 161.95905 | 40.000 | QUARTZ |  | S13 |  |
| 20 | −3974.64491 | 22.406 |  |  |  |  |
| 21 | −745.39682 | 10.000 | QUARTZ |  |  |  |
| 22 | −9743.67518 | 26.532 |  |  |  |  |

TABLE 1-continued

| surface number | radius of curvature | surface distance | material | | | |
|---|---|---|---|---|---|---|
| 23 | 268.27626 | 11.000 | QUARTZ |  | S14 | G4 |
| 24 | 114.96474 | 27.000 |  | E2 | S21 |  |
| 25 | −228.25526 | 11.000 | QUARTZ |  | S22 |  |
| 26 | 167.51021 | 34.000 |  |  | S23 |  |
| 27 | −130.00000 | 11.000 | QUARTZ |  | S24 |  |
| 28 | −1300.88357 | 7.742 |  |  |  |  |
| 29 | −311.67129 | 25.000 | QUARTZ | E3 |  | G5 |
| 30 | −190.88633 | 0.100 |  |  | S31 |  |
| 31 | 2674.55282 | 37.000 | QUARTZ |  |  |  |
| 32 | −228.59122 | 0.100 |  |  | S32 |  |
| 33 | 1317.72265 | 35.000 | QUARTZ |  |  |  |
| 34 | −317.60710 | 0.100 |  |  |  |  |
| 35 | 193.21354 | 50.000 | QUARTZ |  | S33 |  |
| 36 | −1045.73820 | 0.100 |  |  |  |  |
| 37 | 165.16413 | 24.000 | QUARTZ |  | S34 |  |
| 38 | 308.29209 | 7.565 |  |  |  |  |
| 39 | 856.28379 | 11.000 | QUARTZ | E4 |  | G6 |
| 40 | 130.37900 | 35.000 |  |  | S41 |  |
| 41 | −249.45861 | 11.000 | QUARTZ |  | S42 |  |
| 42 | 175.52447 | 32.000 |  |  | S43 |  |
| 43 | −144.77608 | 11.000 | QUARTZ |  | S44 |  |
| 44 | −740.78121 | 3.986 |  |  |  |  |
| 45 | 0.00000 | 5.000 | QUARTZ |  |  |  |
| 46 | 0.00000 | 3.986 |  |  |  |  |
| 47 | 0.00000 | 5.986 | DIAPHRAGM | S |  |  |
| 48 | −613.66107 | 25.598 | QUARTZ | E5 |  | G7 |
| 49 | −187.65130 | 0.100 |  |  | S51 |  |
| 50 | 602.78505 | 35.000 | QUARTZ |  |  |  |
| 51 | −295.54740 | 0.100 |  |  | S52 |  |
| 52 | 213.08484 | 35.000 | QUARTZ |  |  |  |
| 53 | −2955.27523 | 0.100 |  |  |  |  |
| 54 | 173.99718 | 33.578 | QUARTZ |  | S53 |  |
| 55 | 1169.89682 | 0.100 |  |  |  |  |
| 56 | 151.76291 | 32.183 | QUARTZ |  | S54 |  |
| 57 | 296.12642 | 10.384 |  |  |  |  |
| 58 | −963.67753 | 26.400 | QUARTZ |  |  |  |
| 59 | 1673.62416 | 1.909 |  |  |  |  |
| 60 | 787.04410 | 63.396 | QUARTZ |  |  |  |
| 61 | −773.03300 | 20.467 |  |  |  |  |
|  | 0.00000 |  |  |  | WAFER |  |

TABLE 2

| Surface Number |  | \|Lxφconvex\| | \|Lxφconcave\| |
|---|---|---|---|
| 14 | S11 | 4.36 |  |
| 18 | S12 | 2.75 |  |
| 19 | S13 | 3.59 |  |
| 23 | S14 | 2.17 |  |
| 24 | S21 |  | 5.06 |
| 25 | S22 |  | 2.55 |
| 26 | S23 |  | 3.47 |
| 27 | S24 |  | 4.47 |
| 30 | S31 | 3.05 |  |
| 32 | S32 | 2.54 |  |
| 35 | S33 | 3.01 |  |
| 37 | S34 | 3.52 |  |
| 40 | S41 |  | 4.46 |
| 41 | S42 |  | 2.33 |
| 42 | S43 |  | 3.31 |
| 43 | S44 |  | 4.02 |
| 49 | S51 | 3.10 |  |
| 51 | S52 | 1.97 |  |
| 54 | S53 | 3.34 |  |
| 56 | S54 | 3.83 |  |

Second embodiment

The second embodiment is a projection optical system having ¼ magnification. A numerical aperture NA on the image side is 0.6 and a maximum object height is 52.8 mm. An area in a reticle size of 74.5×74.5 mm² (lump-some exposure) or 90×55 mm² (scanned exposure) can be exposed.

The optical glass is a fused quartz having a refractive index of 1.50839. An optical system having an excellent performance is provided by using a total of 30 lenses, thus correcting for spherical aberration, coma aberration, astigmatism, and distortional aberration for a 248 nm monochromatic wavelength of an ultraviolet excimer laser.

A very small optical system, which has a maximum effective lens diameter of 220 mm or less and an object-image distance of 1200 mm, can be obtained.

Figure 14:
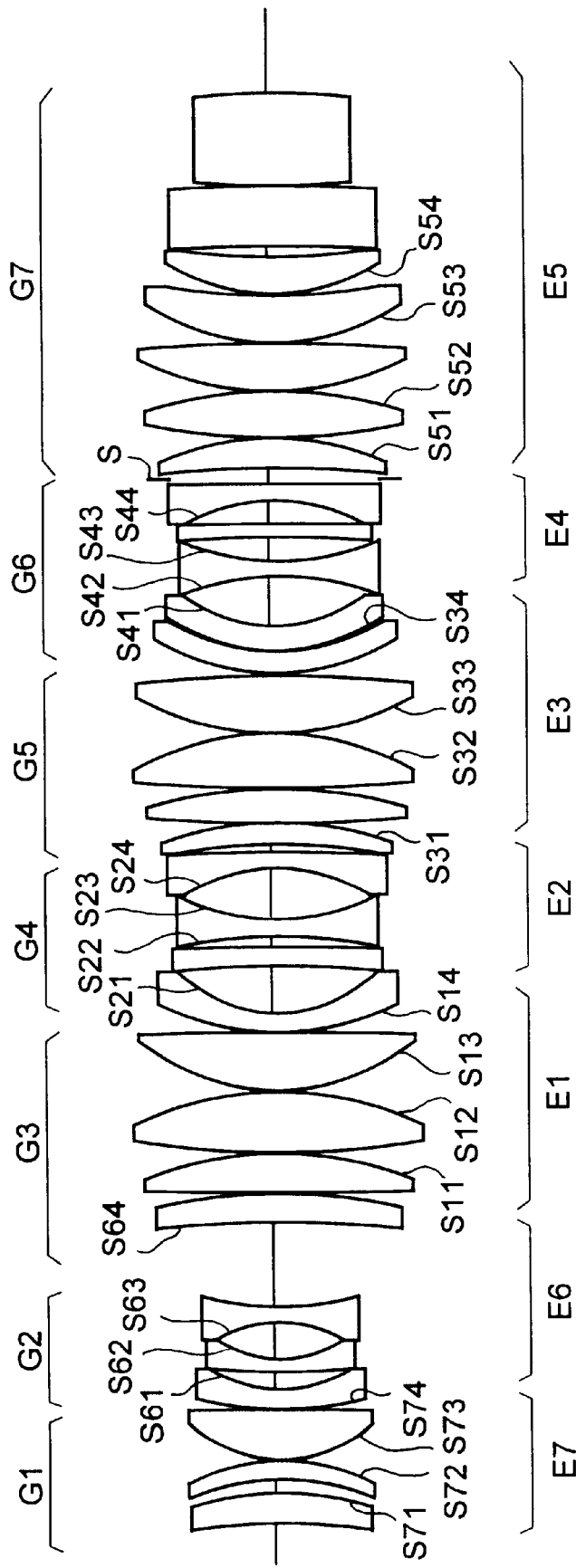
FIG. 14 shows a cross section of a projection optical system according to the second embodiment of the invention.
Figure 15A:
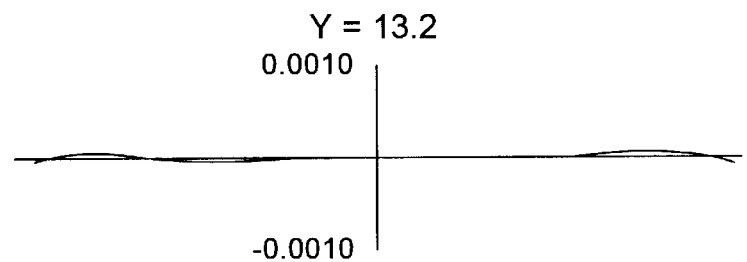
FIGS. 15A through 15D show diagrams representing side aberration of the projection optical system according to the second embodiment.
Figure 15B:
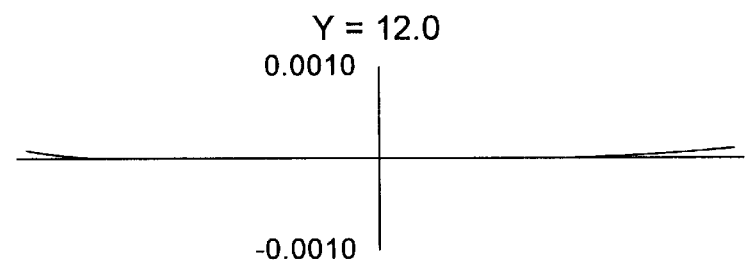
Figure 15C:
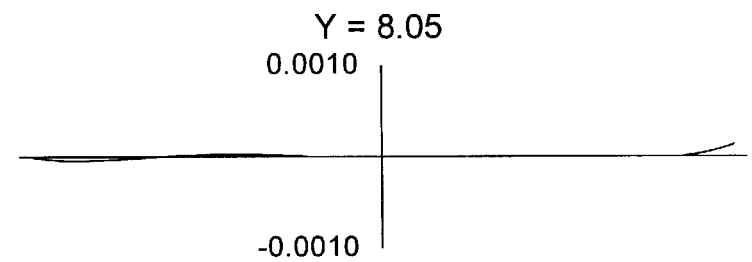
Figure 15D:
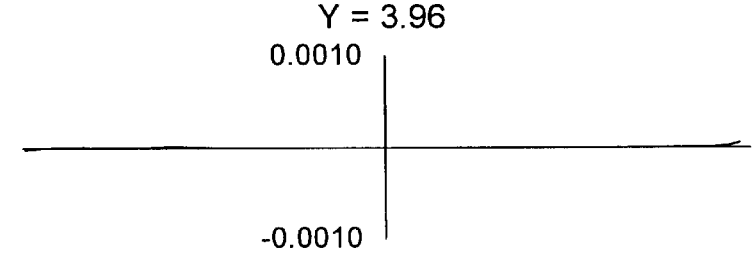

Parameters of the second embodiment are shown in Table 3. FIG. 14 shows a cross section of the optical system of the second embodiment, FIG. 15 shows a side aberration of the optical system of the second embodiment, and FIG. 16 shows an astigmatism and a distortional aberration of the optical system of the second embodiment. In Table 3, the fused quartz is designated as QUARTZ. The side aberration is shown for image heights Y of 13.2, 12.0, 8.05, and 3.96 mm. In the figure representing astigmatism, an origin is the best image plane, and the Gaussian image plane is not a standard.

The convex surfaces facing each other in the first element group E1 are S11 through S14. The concave surfaces facing each other in the second element group E2 are S21 through S24. The convex surfaces facing each other in the third element group E3 are S31 through S34. The concave surfaces facing each other in the fourth element group E4 are S41 through S44. The convex surfaces facing in the fifth element group E5 which face each other are S51 through S54.

Conditions and corresponding values are shown in Table 4.

TABLE 3

| surface number | radius of curvature | surface distance | material | | | |
|---|---|---|---|---|---|---|
| | 0.00000 | 92.000 | | reticle | | |
| 1 | 2493.23732 | 25.000 | QUARTZ | | E7 | G1 |
| 2 | −236.58134 | 10.000 | | S71 | | |
| 3 | −148.11147 | 15.000 | QUARTZ | | | |
| 4 | −148.34915 | 0.100 | | S72 | | |
| 5 | 119.90171 | 35.000 | QUARTZ | | S73 | |
| 6 | 1824.15576 | 0.100 | | | | |
| 7 | 274.63898 | 15.000 | QUARTZ | | S74 | G2 |
| 8 | 106.93904 | 13.726 | | E6 | S61 | |
| 9 | 671.60093 | 11.000 | QUARTZ | | | |
| 10 | 110.28695 | 25.000 | | S62 | | |
| 11 | −125.90464 | 11.000 | QUARTZ | | S63 | |
| 12 | 172.41263 | 64.790 | | | | |
| 13 | −1143.55993 | 23.000 | QUARTZ | | S64 | G3 |
| 14 | −307.74033 | 0.100 | | E1 | | |
| 15 | −8562.31817 | 30.000 | QUARTZ | | | |
| 16 | −290.74206 | 0.100 | | S11 | | |
| 17 | 1020.26237 | 45.000 | QUARTZ | | | |
| 18 | −255.59916 | 0.100 | | S12 | | |
| 19 | 171.99888 | 45.000 | QUARTZ | | S13 | |
| 20 | −14811.05009 | 0.100 | | | | |
| 21 | 193.20293 | 15.000 | QUARTZ | | S14 | G4 |
| 22 | 118.39968 | 34.814 | | E2 | S21 | |
| 23 | −818.52074 | 15.000 | QUARTZ | | | |
| 24 | 6209.59730 | 9.300 | | | | |
| 25 | −335.94897 | 11.000 | QUARTZ | | S22 | |
| 26 | 140.10037 | 40.000 | | S23 | | |
| 27 | −153.76519 | 11.000 | QUARTZ | | S24 | |
| 28 | 1508.16730 | 9.572 | | | | |
| 29 | −482.58926 | 20.000 | QUARTZ | | E3 | G5 |
| 30 | −251.12791 | 0.100 | | S31 | | |
| 31 | −3776.08034 | 23.000 | QUARTZ | | | |
| 32 | −458.90305 | 0.100 | | | | |
| 33 | 707.19806 | 40.000 | QUARTZ | | | |
| 34 | −249.98389 | 0.100 | | S32 | | |
| 35 | 196.24303 | 50.000 | QUARTZ | | S33 | |

TABLE 3-continued

| surface number | radius of curvature | surface distance | material | | | |
|---|---|---|---|---|---|---|
| 36 | −761.51138 | 0.100 | | | | |
| 37 | 228.86296 | 15.000 | QUARTZ | | | G6 |
| 38 | 159.74733 | 0.100 | | | | |
| 39 | 145.33393 | 20.000 | QUARTZ | | S34 | |
| 40 | 141.86524 | 35.000 | | E4 | S41 | |
| 41 | −271.75071 | 11.000 | QUARTZ | | S42 | |
| 42 | 155.67524 | 20.000 | | | S43 | |
| 43 | −744.49686 | 15.000 | QUARTZ | | | |
| 44 | −729.49976 | 14.697 | | | | |
| 45 | −153.05350 | 11.000 | QUARTZ | | S44 | |
| 46 | −47484.19937 | 5.000 | | | | |
| 47 | 0.00000 | 7.000 | DIAPHRAGM | S | | |
| 48 | −897.96322 | 23.906 | QUARTZ | E5 | | G7 |
| 49 | −210.31265 | 0.100 | | | S51 | |
| 50 | 701.37353 | 35.000 | QUARTZ | | | |
| 51 | −310.76514 | 0.100 | | | S52 | |
| 52 | 262.98965 | 35.000 | QUARTZ | | | |
| 53 | −1180.57855 | 0.100 | | | | |
| 54 | 181.39870 | 40.000 | QUARTZ | | S53 | |
| 55 | 1390.24765 | 0.100 | | | | |
| 56 | 154.33848 | 26.840 | QUARTZ | | S54 | |
| 57 | 456.12487 | 12.730 | | | | |
| 58 | −494.82949 | 44.682 | QUARTZ | | | |
| 59 | −455.26201 | 0.100 | | | | |
| 60 | 692.73137 | 66.877 | QUARTZ | | | |
| 61 | 1914.75411 | 20.467 | | | | |
| | 0.00000 | | | | | WAFER |

TABLE 4

| Surface Number | | |Lxφconvex| | |Lxφconcave| |
|---|---|---|---|
| 16 | S11 | 2.10 | |
| 18 | S12 | 2.39 | |
| 19 | S13 | 3.55 | |
| 21 | S14 | 3.16 | |
| 22 | S21 | | 5.15 |
| 25 | S22 | | 1.82 |
| 26 | S23 | | 4.35 |
| 27 | S24 | | 3.97 |
| 30 | S31 | 2.43 | |
| 34 | S32 | 2.44 | |
| 35 | S33 | 3.11 | |
| 39 | S34 | 4.20 | |
| 40 | S41 | | 4.30 |
| 41 | S42 | | 2.24 |
| 42 | S43 | | 3.92 |
| 45 | S44 | | 3.99 |
| 49 | S51 | 2.90 | |
| 51 | S52 | 1.96 | |
| 54 | S53 | 3.36 | |
| 56 | S54 | 3.95 | |

By providing an arrangement in which an element group with a positive refractive power and an element group with a negative refractive power are positioned alternately, and by providing an arrangement in which two pairs of surfaces facing in opposite directions are included, the overall length and diameter of a lens principal to the optical system are made smaller and the generation of aberrations is minimized. The Petzval sum, in particular, can be kept to a low value. Therefore, a small optical system which satisfies both high resolution and wide exposure area can be obtained.

I claim:

1. A projection optical system having an object side and comprising in order from the object side:

a first element group with a positive refractive power having at least two pairs of convex surfaces facing each other;

a second element group with a negative refractive power having at least two pairs of concave surfaces facing each other;

a third element group with a positive refractive power having at least two pairs of convex surfaces facing each other;

a fourth element group with a negative refractive power having at least two pairs of concave surfaces facing each other; and a fifth element group with a positive refractive power having at least two pairs of convex surfaces facing each other;

wherein, when refractive powers of the concave surfaces facing each other of each of the second element group and the fourth element group are øconcave, refractive powers of facing convex surfaces of each of the first element group, the third element group and the fifth element group are øconvex, and a distance between an object and an image is L, 0.5<|L×øconcave|<15, and 0.5<|L×øconvex|<15.

2. The projection optical system as claimed in claim 1 and further comprising a sixth element group with a negative refractive power on an object side of said first through said fifth element groups.

3. The projection optical system as claimed in claim 2, wherein the sixth element group has at least two concave surfaces.

4. The projection optical system as claimed in claim 3 and further comprising a seventh element group with a positive refractive power on an object side of the first through the fifth element groups.

5. The projection optical system as claimed in claim 4, wherein the seventh element group is disposed on an object side of the sixth element group.

6. The projection optical system as claimed in claim 2 and further comprising a seventh element group with a positive refractive power on an object side of the first through the fifth element groups.

7. The projection optical system as claimed in claim 6, wherein the seventh element group is disposed on an object side of the sixth element group.

8. The projection optical system as claimed in claim 1 and further comprising an additional element group with a positive refractive power on an object side of the first through the fifth element groups.

9. The projection optical system as claimed in claim 8, wherein the additional element group has at least two convex surfaces.

10. The projection optical system as claimed in claim 1 and further comprising a sixth element group having at least two concave surfaces at one side of said first through said fifth element groups.

11. A projection optical system comprising:

a first lens group having at least two positive lenses and a positive refractive power as a whole;

a second lens group having at least two negative lenses and a negative refractive power as a whole;

a third lens group having at least two positive lenses and a positive refractive power as a whole;

a fourth lens group having at least two negative lenses and a negative refractive power as a whole;

a fifth lens group having at least two positive lenses and a positive refractive power as a whole;

a sixth lens group having at least two negative lenses and a negative refractive power as a whole; and a seventh lens group having at least two positive lenses and a positive refractive power as a whole.

12. A projection optical system having an object side and comprising:

a first plurality of element groups with positive refractive powers, each element group of said first plurality of element groups including multiple pairs of convex surfaces;

a second plurality of element groups with negative refractive powers, each element group of said second plurality of element groups including multiple pairs of concave surfaces, each element group of said second plurality of element groups being interposed between two element groups of said first plurality of element groups; and an additional element group with a negative refractive power on an object side of said first and second pluralities of element groups;

wherein, when refractive powers of the concave surfaces of second plurality of element groups are øconcave, the refractive powers of the convex surfaces of the first plurality of element groups are øconvex, and a distance between an object and an image is L, 0.5<|L×øconcave|<15; and 0.5<|L×øconvex|<15.

13. The projection optical system as claimed in claim 12, wherein the additional element group has at least two concave surfaces.

14. The projection optical system as claimed in claim 13, and further comprising a further element group with a positive refractive power on an object side of the first and second pluralities of element groups.

15. The projection optical system as claimed in claim 14, wherein the further element group is disposed on an object side of the additional element group.

16. The projection optical system as claimed in claim 12 and further comprising a further element group with a positive refractive power on an object side of the first and second pluralities of element groups.

17. The projection optical system as claimed in claim 16, wherein the further element group is disposed on an object side of the additional element group.

18. A projection optical system having an object side and comprising:

a first plurality of element groups with positive refractive powers, each element group of said first plurality of element groups including multiple pairs of convex surfaces;

a second plurality of element groups with negative refractive powers, each element group of said second plurality of element groups including multiple pairs of concave surfaces, each element group of said second plurality of element groups being interposed between two element groups of said first plurality of element groups; and an additional element group with a positive refractive power on an object side of said first and second pluralities of element groups;

wherein, when refractive powers of the concave surfaces of second plurality of element groups are øconcave, the refractive powers of the convex surfaces of the first plurality of element groups are ⌀convex, and a distance between an object and an image is L, 0.5<|L×⌀concave|<15; and.

0.5<|L×⌀convex|<15

19. The projection optical system as claimed in claim 18, wherein the additional element group has at least two convex surfaces.

* * * * *